(12) United States Patent
Schmaelzle et al.

(10) Patent No.: US 8,040,609 B1
(45) Date of Patent: Oct. 18, 2011

(54) SELF-ADJUSTING SOLAR LIGHT TRANSMISSION APPARATUS

(75) Inventors: Philipp H. Schmaelzle, Los Altos, CA (US); Gregory L. Whiting, Mountain View, CA (US); Joerg Martini, San Francisco, CA (US); David K. Fork, Mountain View, CA (US); Patrick Y. Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/955,743

(22) Filed: Nov. 29, 2010

(51) Int. Cl.
*F24J 2/00* (2006.01)
*F24J 2/46* (2006.01)
*H02N 6/00* (2006.01)

(52) U.S. Cl. .......... 359/591; 136/246; 136/89; 356/415; 356/432; 356/445; 356/446; 126/589; 126/585

(58) Field of Classification Search .................. 126/585, 126/589; 422/186.3; 359/591; 356/343, 356/415, 432, 445–446; 136/89, 246, 259; 252/582; 428/394
See application file for complete search history.

(56) References Cited

U.S. PATENT DOCUMENTS

| | | | |
|---|---|---|---|
| 3,988,166 A | 10/1976 | Beam | |
| 4,021,267 A | 5/1977 | Dettling | |
| 4,045,246 A | 8/1977 | Mlavsky et al. | |
| 4,053,327 A * | 10/1977 | Meulenberg, Jr. ............ | 136/256 |
| 4,084,985 A | 4/1978 | Evans, Jr. | |
| 4,086,485 A | 4/1978 | Kaplow et al. | |
| 4,095,997 A | 6/1978 | Griffiths | |
| 4,131,485 A | 12/1978 | Meinel et al. | |
| 4,148,301 A | 4/1979 | Cluff | |
| 4,177,083 A | 12/1979 | Kennedy | |
| 4,221,468 A | 9/1980 | Macken | |
| 4,224,081 A | 9/1980 | Kawamura et al. | |
| 4,234,351 A | 11/1980 | Deminet et al. | |

(Continued)

FOREIGN PATENT DOCUMENTS

CN 2606309 Y 3/2004

(Continued)

OTHER PUBLICATIONS

Mulligan et al. "A Flat-Plate Concentrator: Micro-Concentrator Design Overview", 2000 IEEE, pp. 1495-1497.

(Continued)

*Primary Examiner* — Clayton E LaBalle
*Assistant Examiner* — Kevin Butler
(74) *Attorney, Agent, or Firm* — Bever, Hoffman & Harms, LLP; Patrick T. Bever

(57) ABSTRACT

A self-adjusting solar light transmission (daylighting) apparatus includes a sunlight concentrating member (e.g., a lens array) for concentrating direct sunlight in focal zone regions disposed inside a sheet containing an evenly-distributed stimuli-responsive material (SRM) that has a relatively high transparency state in the absence of concentrated sunlight, and changes to a relatively opaque (light scattering or absorbing) state in small portions located in the focal zone regions in response to concentrated direct sunlight. Thereby, 80% or more of direct sunlight is prevented from passing through the apparatus, but 80% or more of diffuse light is passed. The outer sheet surfaces are locally parallel (e.g., planar) such that sunlight scattered by the light-scattering SRM portions is transmitted by total internal reflection through the remaining transparent sheet material, and outcoupled to one or more optional solar energy absorbing structures (e.g., heatsinks or PV cells) disposed along the peripheral edge of the sheet.

27 Claims, 8 Drawing Sheets

U.S. PATENT DOCUMENTS

| Patent Number | Kind | Date | Inventor(s) | Ref |
|---|---|---|---|---|
| 4,320,251 | A | 3/1982 | Narasimhan et al. | |
| 4,331,703 | A | 5/1982 | Lindmayer | |
| 4,337,758 | A | 7/1982 | Meinel et al. | |
| 4,683,348 | A | 7/1987 | Pidgeon et al. | |
| 4,711,972 | A | 12/1987 | O'Neill | |
| 4,746,370 | A | 5/1988 | Woolf | |
| 4,792,685 | A | 12/1988 | Yamakawa | |
| 4,841,946 | A | 6/1989 | Marks | |
| 4,847,349 | A | 7/1989 | Ohta et al. | |
| 4,849,028 | A | 7/1989 | Krause | |
| 4,855,884 | A | 8/1989 | Richardson | |
| 4,947,825 | A | 8/1990 | Moriarty | |
| 4,952,026 | A | 8/1990 | Bellman et al. | |
| 5,004,319 | A | 4/1991 | Smither | |
| 5,062,899 | A | 11/1991 | Kruer | |
| 5,089,055 | A | 2/1992 | Nakamura | |
| 5,167,724 | A | 12/1992 | Chiang | |
| 5,180,441 | A | 1/1993 | Cornwall et al. | |
| 5,216,543 | A | 6/1993 | Calhoun | |
| 5,344,496 | A | 9/1994 | Stern et al. | |
| 5,389,159 | A | 2/1995 | Kataoka et al. | |
| 5,404,869 | A | 4/1995 | Parkyn, Jr. et al. | |
| 5,501,743 | A | 3/1996 | Cherney | |
| 5,529,054 | A | 6/1996 | Shoen | |
| 5,540,216 | A | 7/1996 | Rasmusson | |
| 5,552,820 | A | 9/1996 | Genovese | |
| 5,559,677 | A | 9/1996 | Errichiello | |
| 6,011,307 | A | 1/2000 | Jiang et al. | |
| 6,020,554 | A | 2/2000 | Kaminar et al. | |
| 6,091,017 | A | 7/2000 | Stern | |
| 6,094,273 | A * | 7/2000 | Asher et al. | 356/415 |
| 6,097,530 | A * | 8/2000 | Asher et al. | 359/288 |
| 6,118,067 | A | 9/2000 | Lashley et al. | |
| 6,130,465 | A | 10/2000 | Cole | |
| 6,140,570 | A | 10/2000 | Kariya | |
| 6,165,389 | A * | 12/2000 | Asher et al. | 252/582 |
| 6,274,508 | B1 | 8/2001 | Jacobsen et al. | |
| 6,278,054 | B1 | 8/2001 | Ho et al. | |
| 6,379,521 | B1 | 4/2002 | Nishio | |
| 6,407,329 | B1 | 6/2002 | Iino et al. | |
| 6,410,644 | B2 * | 6/2002 | Mumick et al. | 525/60 |
| 6,420,266 | B1 | 7/2002 | Smith et al. | |
| 6,451,429 | B2 * | 9/2002 | Mumick et al. | 428/394 |
| 6,479,395 | B1 | 11/2002 | Smith et al. | |
| 6,527,964 | B1 | 3/2003 | Smith et al. | |
| 6,531,653 | B1 | 3/2003 | Glenn et al. | |
| 6,568,863 | B2 | 5/2003 | Murata | |
| 6,590,235 | B2 | 7/2003 | Carey et al. | |
| 6,597,510 | B2 | 7/2003 | Bunkenburg et al. | |
| 6,623,579 | B1 | 9/2003 | Smith et al. | |
| 6,896,381 | B2 | 5/2005 | Benitez et al. | |
| 6,958,868 | B1 | 10/2005 | Pender | |
| 7,045,794 | B1 | 5/2006 | Spallas et al. | |
| 7,152,985 | B2 | 12/2006 | Benitez et al. | |
| 7,160,522 | B2 | 1/2007 | Minano Dominguez et al. | |
| 7,181,378 | B2 | 2/2007 | Benitez et al. | |
| 7,638,708 | B2 * | 12/2009 | Fork et al. | 136/246 |
| 2002/0056473 | A1 | 5/2002 | Chandra et al. | |
| 2002/0148497 | A1 | 10/2002 | Sasaoka et al. | |
| 2002/0149107 | A1 | 10/2002 | Chang et al. | |
| 2003/0232174 | A1 | 12/2003 | Chang et al. | |
| 2004/0031517 | A1 | 2/2004 | Bareis | |
| 2004/0070855 | A1 | 4/2004 | Benitez et al. | |
| 2004/0084077 | A1 | 5/2004 | Aylaian | |
| 2004/0151014 | A1 | 8/2004 | Speakman | |
| 2004/0191422 | A1 | 9/2004 | Kataoka | |
| 2004/0211460 | A1 | 10/2004 | Simburger et al. | |
| 2005/0029236 | A1 | 2/2005 | Gambino et al. | |
| 2005/0034751 | A1 | 2/2005 | Gross et al. | |
| 2005/0046977 | A1 | 3/2005 | Shifman | |
| 2005/0081908 | A1 | 4/2005 | Stewart | |
| 2006/0207650 | A1 | 9/2006 | Winston et al. | |
| 2006/0231133 | A1 | 10/2006 | Fork et al. | |
| 2008/0047605 | A1 | 2/2008 | Benitez et al. | |
| 2008/0186593 | A1 | 8/2008 | Chan et al. | |
| 2009/0056789 | A1 * | 3/2009 | Draganov | 136/246 |

FOREIGN PATENT DOCUMENTS

| | | |
|---|---|---|
| CN | 1854637 A | 11/2006 |
| DE | 3104690 A1 | 8/1982 |
| DE | 19735281 A1 | 2/1999 |
| EP | 0200496 A2 | 11/1986 |
| EP | 1715260 A | 10/2006 |
| JP | 2-122159 A | 5/1990 |
| WO | 94/28361 A1 | 12/1994 |
| WO | 00/49421 A1 | 8/2000 |
| WO | 00/49658 A1 | 8/2000 |
| WO | 02/097724 A1 | 12/2002 |
| WO | 2007/104028 A1 | 9/2007 |

OTHER PUBLICATIONS

Terao et al. "A Mirror-Less Design for Micro-Concentrator Modules", Conference Record of the 28th IEEE Photovoltaic Specialists Conference (2000) pp. 1416-1419.

Mulligan et al. "Development of Chip-Size Silicon Solar Cells", IEEE Photovoltaic Specialists Conference, 2000, pp. 158-163.

Bett et al. "FLATCON and FLASHCON Concepts for High Concentration PV", Presented at the 19th European Photovoltaic Solar Energy Conf., Jun. 7-11, 2004, Paris, 4 pages.

Benitez et al. "High-Concentration Mirror-Based Kohler Integrating System for Tandem Solar Cells", WCPEC2006, 4 pages.

Terao, Akira "MicroDish: A Novel Reflective Optic for Flat-Plate Micro-Concentrator", SPIE's 49th Annual Meeting, Aug. 2-6, 2004, Denver, Colorado, USA, 9 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Gordon et al. "Optical performance at the thermodynamic limit with tailored imaging designs", Applied Optics, in press, Dec. 2004, 16 pages.

Alvarez et al. "RXI Concentrator for 1000X Photovoltaic Energy Conversion", Proc. SPIE, vol. 3781, 30 (1999), 9 pages.

Swanson, Richard M. "The Promise of Concentrators", Prog. Photovolt. Res. Appl. 8, pp. 93-111 (2000).

Nguyen, Luu "Wafer Level Packaging for Analog/Mixed Signal Applications", MEPTEC Int. Wafer Level Packaging Conference, Aug. 22, 2002, 41 pages.

* cited by examiner

SELF-ADJUSTING SOLAR LIGHT TRANSMISSION APPARATUS

FIELD OF THE INVENTION

The present invention is directed to solar light transmission (skylighting) apparatus, and more particularly to skylighting apparatus utilizing a stimuli-responsive material (SRM), such as a phase-change material (PCM) having a lower critical solution temperature (LCST) slightly above room temperature, which is dispersed in a waveguide-like sheet to form self-aligned light scattering structures in order to prevent the transmission of direct sunlight.

BACKGROUND OF THE INVENTION

Architectural daylighting is the practice of placing windows http://en.wikipedia.org/wiki/Window or other openings and reflective surfaces so that, during the day, natural light provides effective internal lighting within a building structure. Particular attention is given to daylighting while designing a building when the aim is to maximize visual comfort or to reduce energy use, for example, from the reduced use of artificial (electric) lighting. One form of architectural daylighting involves utilizing a transparent or semitransparent sheet (e.g., glass) strategically mounted on a roof or vertical side wall of a building such that daylight is able to enter interior spaces of the building. In this way, sunlight is used to reduce our dependence on conventional (e.g., oil, coal and gas) energy sources.

Architectural daylighting arrangements are typically designed to deal with two types of daylight: diffuse (indirect) light and direct sunlight. Diffuse light is made up of non-parallel light beams originating from the sky hemisphere and possibly as scattered or reflected light from various physical objects in our environment. Diffuse light arrives at a give point with a low intensity (luminance) but since the angular zone of origin is large, it has a significant contribution to the light flux (e.g. ~15% on a clear day). Diffuse light has particularly beneficial properties for daylighting. In contrast, direct sunlight is made up of approximately parallel light beams received directly from the sun, and has a relatively high intensity (luminance) in comparison to diffuse light. The ideal architectural daylighting arrangement attempts to maximize the amount of diffuse light allowed into a room/building while minimizing the amount of admitted direct sunlight in order to avoid undesirable high radiance areas, undesirable fluctuations of the lighting level, and/or excessive solar heating.

A problem with existing daylighting devices (e.g., clear, tinted or textured glass) is that these devices typically either allow too much direct sunlight or not enough diffuse light. Clear glass maximizes the amount of diffuse light transmitted into a room, but also allows too much direct sunlight during certain portions of the daylight hours. Tinted or textured glass serves to reduce the amount of direct sunlight, but typically at the cost of reducing the amount of diffuse light as well. The underlying disadvantage is that conventional systems have approximately similar transmission for direct and diffuse light.

What is needed is a solar light transmission apparatus that maximizes the amount of transmitted diffuse light, but minimizes the amount of transmitted direct sunlight. To achieve this, what is furthermore needed is a solar light transmission apparatus that in operation exhibits pronouncedly different transmission for direct and diffuse light, respectively.

SUMMARY OF THE INVENTION

The present invention is directed to a solar light (sunlight) transmission apparatus including a planar or dome-shaped sheet containing a stimuli-responsive material (SRM), and a solar radiation (sunlight) concentrating member (e.g., a lens array) disposed to concentrate sunlight on the sheet. The SRM is evenly distributed throughout a material layer disposed in the sheet, and the solar radiation concentrating member is formed and arranged such that the sunlight is concentrated (e.g., focused) in one or more focal zones (region) located inside the material layer. The SRM is characterized by assuming a relatively high transparency (first) state in the absence of direct sunlight, and by a changing to a relatively opaque (second) state when subjected to a predetermined amount concentrated solar radiation (i.e., solar energy in the form of heat or light). In the preferred embodiment, the sheet is formed such that only a relatively small portion (e.g., 1% to 10% of the cross-sectional area) of the SRM in the material layer changes from the relatively transparent first state to the opaque second state, where the portion is disposed in the focal zone regions that surround or are otherwise disposed adjacent focal points defined by optical elements (e.g., lenses) of the sunlight concentrating member. By forming the SRM-bearing material layer such that the SRM portion generates opaque/scattering (second) state "structures" in the focal zones where direct sunlight is concentrated, the apparatus serves to prevent (e.g., absorb, reflect or scatter) most of the direct sunlight from passing through the apparatus and into the interior space disposed under the apparatus, thereby preventing undesirable high radiance areas, undesirable fluctuations of the lighting level, and/or excessive solar heating. By positioning the sunlight concentrating member (e.g., lens array) to focus sunlight at focal points disposed inside the material layer, and by distributing the SRM evenly throughout the material layer, the apparatus automatically generates light scattering regions in any portion of the material layer that coincides with the current focal points, which change as the sun's position changes throughout the day, thereby effectively providing a dynamically self-aligning mechanism that blocks most direct sunlight while admitting most diffuse light at all times during daylight hours.

According to an embodiment of the present invention, the SRM is distributed in the material layer in suitable amount such that the SRM (and, hence, the material layer) remains substantially entirely transparent to solar radiation in the first state, and such that, when the portion of the SRM located in the focal zones is in the opaque/scattering (second) state, at least 40% of the concentrated solar radiation directed into each focal zone is redirected by the changed/opaque portion into the remaining unchanged/transparent portion of the material layer. In one embodiment, the upper and lower boundary surfaces of the sheet are essentially entirely smooth, whereby a large portion of the redirected concentrated solar radiation that is scattered or otherwise redirected from the changed/opaque SRM portion is temporarily retained within the sheet by total internal reflection (TIR) between the upper and lower boundary surfaces. The amount of captured sunlight transmitted by TIR to peripheral solar energy collectors (e.g., heat sinks or solar energy receiver/converters such as photovoltaic cells) is further enhanced by distributing the SRM in the material layer in a suitable amount that generates minimally sized opaque/scattering portions in the focal zones surrounding each focal point, whereby the percentage of the SRM that remains in the transparent state is maximized to maximize the amount of sunlight transmitted from the sheet, which acts as a lightguide in this embodiment, to the peripheral solar energy collectors. Furthermore, small volumes of focal zones enable fast heating and fast cooling and therefore a fast response of the optical properties, which is desirable to effectively suppress fluctuations in transmitted light level.

According to another aspect of the present invention, the SRM is further characterized such that the SRM portion disposed in the focal zone reverses (changes back) from the opaque/scattering (second) state to the transparent (first) state when the concentrated solar radiation at the focal points subsequently decreases from a high radiation amount back to a low radiation amount. By utilizing an SRM that is reversible, the self-aligning feature of the present invention is further enhanced in that the changed/opaque SRM portion is automatically repositioned within the material layer throughout the day without requiring repositioning or tracking structures. Moreover, because the state of the SRM is reversed to a transparent (non-scattering) form when the concentrated solar radiation is no longer present, the sheet is characterized by becoming substantially entirely transparent to diffuse light, thereby maximizing the amount of diffuse light passed through the apparatus into an interior room or space.

According to yet another aspect of the present invention, the light concentrating member includes an array of optical elements that are fixedly positioned relative to the sheet and positioned such that a focal point defined by each optical element remains located inside the material layer throughout the daylight hours. That is, those skilled in the art will recognize that the effective focal point of an optical element is determined in part by the incident angle of the focused light (e.g., the angle of the incident sunlight). In accordance with this aspect of the invention, the concentrating member is positioned relative to the sheet such that the effective focal point of the one or more optical elements remains inside the material layer for any incident sunlight direction. With this feature, an inexpensive fixed lens-type concentrating optical system (e.g., a molded glass or plastic lens array) can be used as the light concentrating member by forming the sheet with suitable thickness and positioning the optical system such that a nominal focal point of the various lenses is located in the middle of the material layer, whereby variations in the focal length of the individual lenses and changes in the effective focal lengths throughout the daylight hours are accounted for by providing a suitably thick material layer. With varying angles of incidence, such axial shifts of the focal point have to be expected; particularly with refractive lens arrays, that are amongst the most straightforward to implement, but exhibit field curvature which causes the shift.

According to an embodiment of the present invention, the sheet includes a first transparent layer and a second transparent layer with the SRM-bearing material layer being sandwiched therebetween. The first and second transparent layers are formed using a solid light transparent material (e.g., glass or clear plastic), with the outward-facing surface of the first transparent layer forming the upper (first) surface of the sheet, and the outward-facing surface of the second transparent layer forms the lower (second) surface of the sheet. Disposing the SRM-bearing material layer between the transparent layers facilitates forming the material layer optionally as a liquid or gel, which minimizes manufacturing costs while maximizing the durability of the apparatus.

In one embodiment the SRM-bearing material layer includes a mixture of a transparent gel/liquid carrier material and a temperature dependent SRM material that is dispersed in the carrier material. In a preferred embodiment the SRM material has a lower critical solution temperature (LCST) in the range of 30° C. and 90° C., and in a specific preferred embodiment the SRM-bearing material layer includes poly (N-isopropylacrylamide) (PNIPAM) disposed in water.

In another preferred embodiment, the SRM is selected such that the focal zone has a transparent state with a linear optical attenuation coefficient below 1.00 cm$^{-1}$ when the SRM is in the transparent (first) state, thereby providing suitable conditions for transmitting light (both scattered light from other portions and diffuse light).

In another preferred embodiment, the SRM is selected such that the focal zone has a refractive index greater than 1.34 at 600 nm when the SRM is in the opaque/scattering (second) state, thereby providing suitable conditions for scattering the concentrated solar radiation (sunlight) through the remaining portion of the SRM-bearing material layer that remains unchanged (i.e., in the transparent (first) state).

In another embodiment, the SRM comprises a phase change material (PCM) disposed in said transparent gel or liquid carrier material, wherein said PCM is characterized by assuming a first molecular structure in the transparent (first) state, and by assuming a second molecular structure in the opaque/scattering (second) state. In one specific embodiment the PCM material is a temperature-responsive polymer characterized by assuming a hydrated first molecular structure while a temperature of the solution in the focal zone remains below a predetermined LCST temperature (e.g., in the range of 30° C. and 90° C.), and by changing to a dehydrated second molecular structure when the concentrated solar radiation increases the temperature of the solution in the focal zone above said LCST temperature. Preferably, the PCM material is further characterized by transitioning from the dehydrated molecular structure back to the hydrated molecular structure when the solution temperature is reduced from above the LCST temperature to below the LCST temperature. In a specific embodiment, the PCM material comprises one of poly (N-isopropylacrylamide) (PNIPAM) and Methyl-Cellulose.

In yet another specific embodiment, the SRM is a photochromic material (e.g., Spiropyrans, amongst the many other photochromics that have been developed and are well known) that is characterized by assuming a first chemical state having a light or clear color in the transparent (first) state, and by assuming a second chemical state having a dark color in the opaque/scattering (second) state, where the dark colored state is substantially less transparent than the light colored state. It should be noted that a dark colored second state is not preferred where the generation of electricity via photovoltaics is important.

In yet another specific embodiment, the SRM-bearing material layer mixture further includes one or more of a radiation-absorbing dye, a defoaming agent, a thickening agent, and an anti-freeze agent. The optional absorbing dye (e.g., NIR980A by QCR Solutions) is preferably only absorptive at wavelengths greater than 1000 nm, and assists with light absorption to create the necessary focal heating. The optional defoaming agent (e.g., Poly-Ethylene-Glycol (PEG)) is provided to assist with filling during manufacturing. The optional thickening agent (binder, e.g., a commercial cellulose derivative such as HPMC) is provided to suppress convective heat transport, thereby enhancing the desired temperature contrast between the hot focal zone and the cooler surrounding material. An optional anti-freeze agent may also be added.

In yet another specific embodiment, the SRM-bearing material layer mixture is in a solid form and the transparent layers are omitted (i.e., the upper and lower surfaces of the SRM-bearing material layer form the upper and lower surfaces of the sheet).

In yet another embodiment, the light concentration member includes an array of focusing elements (e.g., lenses or mirrors) disposed such that each of the focusing elements generates an associated focal point inside of the SRM-bearing material layer. In one specific embodiment, a lens array including multiple lens structures disposed in a planar arrangement such that each of the lens structures generates an associated focal point that is located inside of the sheet. The benefit of this arrangement is that the lens arrays can be formed using low-cost molded glass or plastic sheets that also serves as a weather resistant outer layer for the apparatus. The inventors have shown that the functional principle thus created is exceptionally robust, i.e. such the optical elements can be formed even from very inaccurate refractive topographies. Phase change in the focal zones in P-NIPAM has been demonstrated even with a commercial texture glass (Pilkington Cross-Reed ½ in.) that is routinely used in building construction. In a specific embodiment, each of said plurality of lens structures causes a spatial light concentration in some plane of 3× or greater, even more preferably greater than 5×, and yet even more preferably greater than 10×, or preferably beyond. In a specific embodiment, the focal point of each of said plurality of lens structures is positioned within a central 90% portion of the SRM-bearing material layer, and even more preferably located within a central 50% portion of the SRM-bearing material layer. In another specific embodiment, the outer surface of the lens array is flat (planar) to facilitate cleaning and other maintenance. Moreover, forming a lens array separate from the sheet facilitates providing a necessary offset gap between the sheet and the light concentrating structure, which is needed to generate TIR when the sheet is used as a lightguide to direct captured sunlight to the peripheral edge. The offset gap is characterized by being filled with a material that has a pronouncedly lower refractive index than the SRM-bearing material. This is commonly air or inert gas or vacuum. However, other options include aerogels and other known low index solids. It should be noted that methods exist today, to increase the refractive index of a material, e.g. by dispersing sub-wavelength particles of a high refractive index material into it. If such a method was employed to increase the refractive index of the SRM-bearing material substantially, then it would be possible to provide the offset gap from a more common solid material, including polymers, such as silicones.

According to another embodiment of the present invention, the apparatus further includes a rigid frame connected to the peripheral edges of the concentrating means and the sheet such that the concentrating means is maintained at a predetermined gap distance from the upper surface of the sheet. By providing the frame with suitable mounting grooves, the frame both facilitates accurate and inexpensive assembly, and maintains the necessary gap needed to facilitate TIR in the sheet. In one embodiment a solar energy collector/receiver (e.g., a heat sink structure or a PV cell) is also mounted on the frame and disposed along a peripheral edge of the sheet such that the solar energy receiver extends at least a portion of the distance between the upper and lower boundary surfaces of the sheet.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to a modified solar light transmission apparatus in which a stimuli-responsive material (SRM) is evenly distributed throughout a light transmission sheet. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
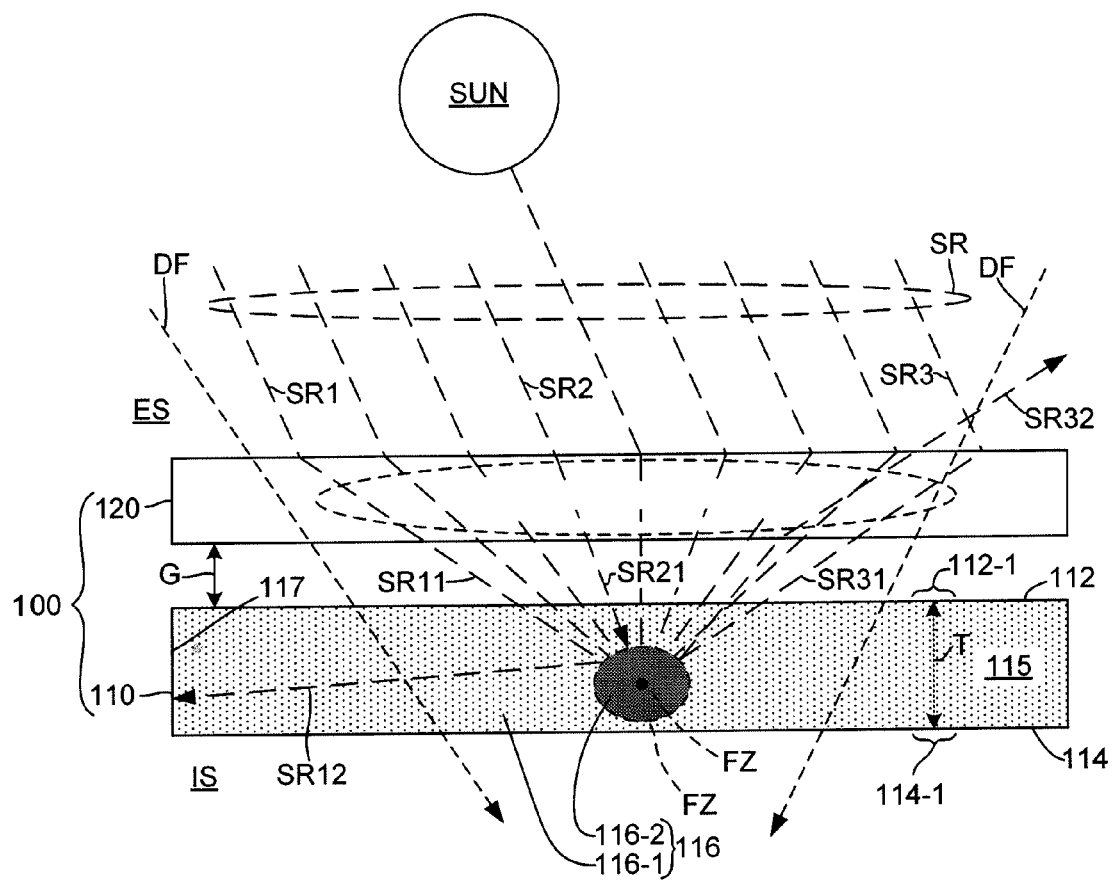
FIG. 1 is a simplified cross-sectional side view showing a solar light transmission apparatus in accordance with a generalized embodiment of the present invention.

FIG. 1 is a simplified cross-sectional side view showing a solar light transmission apparatus 100 in accordance with a generalized embodiment of the present invention. Solar light transmission apparatus 100 generally includes a sheet 110 and a solar radiation (sunlight) concentrating member (e.g., a lens array) 120 disposed to concentrate sunlight within sheet 110.

Referring to the upper portion of FIG. 1, sheet 110 includes an upper (first) boundary surface 112 and an opposing lower (second) boundary surface 114, and a peripheral side edge 117 that extends between upper boundary surface 112 and lower boundary surface 114. In one embodiment, upper boundary surface 112 and lower boundary surface 114 are locally parallel in the sense that opposing regions (e.g., 112-1 and 114-1), which are separated by a thickness T formed by perpendicular lines extending between both regions, are substantially parallel to each other. In one specific embodiment, both upper boundary surface 112 and lower boundary surface 114 are entirely planar and parallel to each other. In another embodiment sheet 110 is a dome-shaped structure wherein upper boundary surface 112 and lower boundary surface 114 are curved surfaces, but remain separated by thickness T at all points.

Sunlight concentrating member 120 is fixedly disposed relative to sheet 110 and serves to concentrate parallel solar radiation (sunlight) beams SR that are directed onto apparatus 100 such that the solar radiation is concentrated at one or more focal points FP that are preferably disposed inside sheet 110, but may be located outside sheet 110 in some embodiments. In particular, sunlight concentrating member 120 focuses incident solar radiation beams SR such that focused solar radiation beams (e.g., solar radiation beams SR1, SR2 and SR3) converge toward focal point FP. When sunlight concentrating member 120 is formed with multiple optical elements that concentrate solar radiation at multiple focal points, the array formed by these multiple focal points is preferably disposed inside sheet 110, but some of the focal points may be inside sheet 110 and some outside sheet 110.

According to an aspect of the present invention, sheet 110 includes a material layer 115 in which a stimuli-responsive material (SRM) 116 is evenly distributed, for example, in a substantially transparent carrier material (i.e., substantially equal concentrations of SRM 116 are found in every region of material layer 115). SRM 116 is characterized in that all SRM 116 (i.e., portions 116-2 disposed inside focal zone FZ adjacent to each focal point FP and remaining portion 116-1 disposed outside focal zone FZ) that is disposed in material layer 115 assumes a substantially transparent (first) state when material layer 115 is subjected to a relatively low (first) amount of concentrated solar radiation, and further characterized in that portion 116-2 (e.g., a region approximately representing 1% to 10% of the cross-sectional area or volume of material layer 115) of SRM 116 that is disposed in focal zone FZ changes from the substantially transparent state to a relatively opaque state (indicated by the relatively dark shading inside focal zone FZ) when the concentrated solar radiation at focal point FP increases from a low radiation (first) amount to a predetermined high radiation (second) amount, while a remaining SRM portion 116-1 (i.e., the portion of SRM 116 in material layer 115 disposed outside focal zone FZ) remains in the transparent state (indicated by the light shading outside of focal zone FZ). The opaque/scattering state of portion 116-2 in FIG. 1 is more opaque (i.e., having a low likelihood of light passing through without being changed in angle and/or intensity) than remaining portion 116-1 that is in the transparent state, whereby concentrated solar radiation directed into focal zone FZ is prevented (i.e., absorbed, scattered, or reflected) by SRM portion 116-2 from passing entirely through sheet 110 from an exterior space OS to an interior space IS. For example, as indicated in FIG. 1, sunlight beam SR1 is indicated as being concentrated by concentrating member 120 such that deflected beam SR11 is directed into focal zone FZ, and is then scattered by SRM portion 116-2 such that redirected beam SR12 is transmitted toward remaining SRM portion 116-2. In contrast, sunlight beam SR2 is indicated as being concentrated by concentrating member 120 such that deflected beam SR21 is directed into focal zone FZ where it is absorbed by SRM portion 116-2, and sunlight beam SR3 is indicated as being concentrated by concentrating member 120 such that deflected beam SR31 is directed into focal zone FZ, and is then reflected by SRM portion 116-2 back through upper surface 112. Each of these exemplary beams illustrate how SRM portion 116-2 may be used to prevent direct solar radiation from passing through sheet 110.

Figure 2:
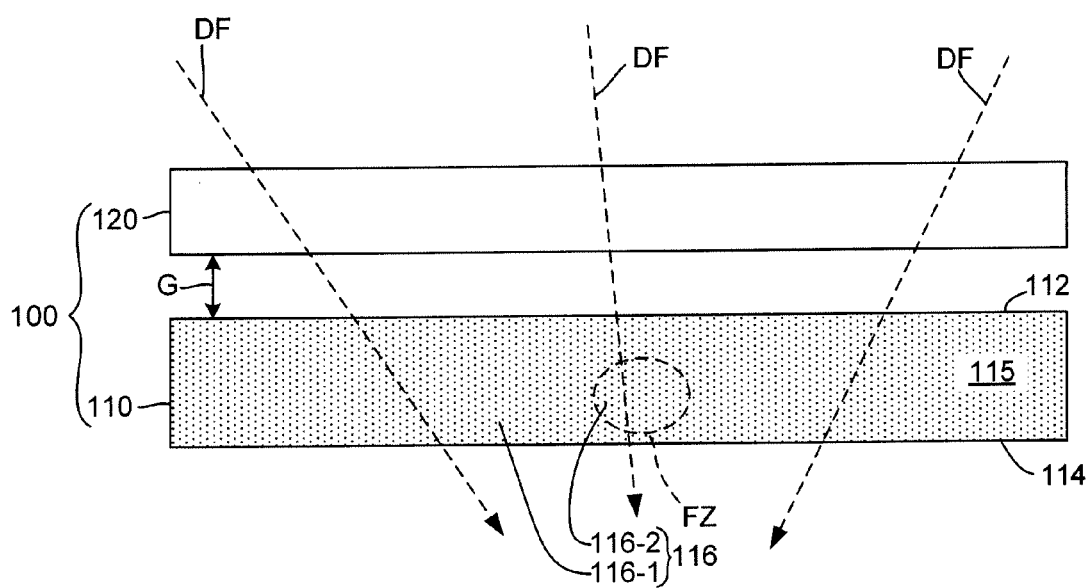
FIG. 2 is a simplified cross-sectional side view showing the apparatus of FIG. 1 in the absence of direct sunlight.

According to an embodiment of the present invention, SRM 116 is distributed in a substantially transparent material that otherwise forms material layer 115, and is provided in suitable amount to produce optimal light scattering characteristics within apparatus 100. That is, an optimal of amount SRM material 116 is disposed in material layer 115 such that, as indicated in FIG. 1, when SRM portion 116-2 in focal zone FZ is in the opaque/scattering (second) state, at least 40% of the concentrated solar radiation SR directed into focal zone FZ is scattered by SRM portion 116-2 into the remaining unchanged/transparent portion 116-1. At the same time, the optimal amount SRM material 116 is selected such that, as indicated in FIG. 2, all SRM 116 (i.e., both portion 116-2 disposed inside focal zone FZ and remaining portion 116-1 disposed outside focal zone FZ) remains substantially transparent to solar radiation in the transparent (first) state and, hence, the entirety of material layer 115 remains substantially entirely transparent to solar radiation when the SRM is in the first state). That is, in one embodiment, material layer 115 is formed such that, when SRM 116 is in its transparent state, material layer 115 remains transmissive to a substantial fraction (i.e., 75% or more) of the visible light wavelength band.

Figure 3A:
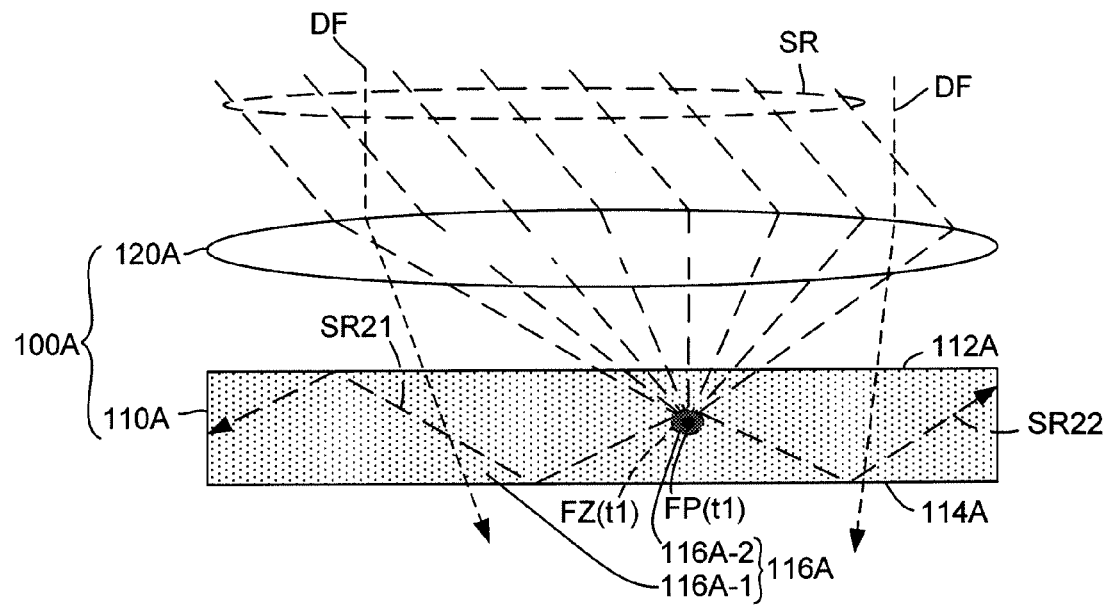
FIGS. 3(A) and 3(B) are simplified cross-sectional side views showing a portion of a solar light transmission apparatus according to a first specific embodiment of the present invention during operation.
Figure 3B:
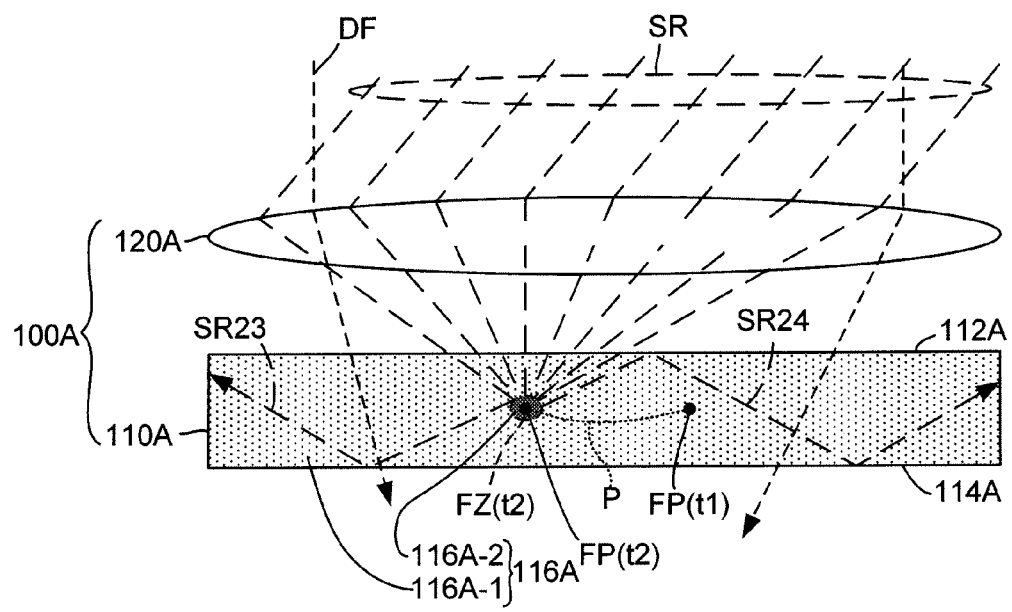

FIGS. 3(A) and 3(B) are simplified cross-sectional side views showing a portion of a solar light transmission apparatus 100A according to a first specific embodiment of the present invention. Apparatus 100A is similar to the generalized embodiment described above with reference to FIGS. 1 and 2, and therefore related structures are identified with similar reference numbers (modified to include the suffix "A"). Apparatus 100A is characterized from the generalized embodiment in the following respects.

First, upper boundary surface 112A and lower boundary surface 114 of material layer 115A are characterized as being essentially entirely smooth (e.g., flat, planar, or otherwise devoid of optical structures such as mirrors, prisms or light absorbing (black) regions, whereby a large portion of the redirected concentrated solar radiation that is scattered or otherwise redirected from SRM portion 116A-2 is temporarily retained within sheet 110A by total internal reflection (TIR) between upper boundary surface 112A and lower boundary surface 114A (e.g., as depicted by arrows SR21 and SR22 in FIG. 3(A)). As such, apparatus 100A utilizes sheet 110A as a lightguide (waveguide) structure to direct captured sunlight out of sheet 110A through peripheral edge 117A, where SRM 116A is used to selectively generate the opaque/scattering structures (i.e., portion 116A-2) within SRM-bearing material layer 115A. The amount of captured sunlight transmitted by TIR to peripheral edge 117A is further enhanced by distributing SRM 116A in material layer 115A in a suitable amount that minimizes the size of opaque/scattering portions 116-2 in focal zones FZ, whereby the percentage of SRM 116A in material layer 115A that remains in the transparent state is maximized, which in turn maximizes the amount of sunlight transmitted out of sheet 110A to, for example, a heat sink or solar receiver (not shown).

According to another aspect of the second embodiment, SRM 116A is further characterized in that portion 116A-2 disposed in the focal zone FZ reverses (changes back) from the opaque/scattering (second) state to the transparent (first) state when the concentrated solar radiation at focal point FP subsequently decreases from a high radiation amount back to a low radiation amount. For example, referring back to FIGS. 1 and 2, when the sun shown in FIG. 1 becomes obscured (e.g., by clouds), producing the situation shown in FIG. 2, the amount of concentrated solar radiation SR directed into focal zone FZ decreases. According to the current aspect, if the reduction in concentrated solar radiation is large enough, SRM portion 116A-2 reverts from the opaque/scattering (second) state to the transparent (first) state (indicated by the light shading in focal zone FZ in FIG. 2) until such a time as the solar radiation is again high enough to again reverse the state of SRM portion 116-2.

Another benefit of this invention arises from the fact that only a small volume fraction (in the focal zone) of the SRM is heated to change its state. The low thermal capacity of the small volumes allows short heat up times. Their large surface to volume ratio allows short cool down times, where the heat is dissipated quickly to the surrounding bulk SRM. Together, this enables a faster response to fluctuating sunlight conditions, than could be envisaged with a system where the bulk SRM layer as a whole undergoes a similar change of optical properties. Thereby, a room daylit through the device experiences significantly reduced objectionable fluctuations in illumination level.

Referring to FIGS. 3(A) and 3(B), by utilizing an SRM that is reversible in the manner described immediately above, the self-aligning feature of the present invention is further enhanced in that the opaque/scattering SRM portion is automatically (dynamically) repositioned within SRM-bearing material layer 115A throughout the day without requiring repositioning or tracking structures. That is, as indicated in FIG. 3(A), where light concentrating member 120A is depicted by a single lens 125A, at a time t1 when solar radiation SR is directed onto lens 125A at a first incident angle, the received sunlight is directed toward an effective focal point FP(t1) in a first region of material layer 115A, whereby light-scattering SRM portion 116A-2 is generate in a first focal zone FZ(t1) surrounding effective focal point FP(t1). FIG. 3(B) depicts apparatus 100A later in the day (time t2) when solar radiation SR is directed onto lens 125A at a second incident angle, and the received sunlight is directed by lens 125A toward an effective focal point FP(t2) in a second region (i.e., focal zone FZ(t2)) of material layer 115A, whereby light-scattering SRM portion 116-2 is generated in a second focal region FZ(t2) surrounding effective focal point FP(t2). Because the state of SRM 116A is reversed to a transparent (non-scattering) form when the concentrated solar radiation is no longer present, light-scattering SRM portions 116A-2 formed earlier in the day (e.g., shown in focal zone FZ(t1) in FIG. 3(A)) are eventually changed back to the transparent state and replaced with light-scattering SRM portions 116A-2 formed later in the day (e.g., shown in focal zone FZ(t2) in FIG. 3(B)). As such, the light-scattering SRM portion 116A-2 in effect "moves" through material layer 115A (e.g., as depicted by dashed line P in FIG. 3(B)) as the sun's position changes during daylight hours, thus both providing a self-aligned the light scattering structure and maintaining optimal light transmitting conditions within material layer 115A.

According to yet another aspect of the present embodiment, optical elements 125A of light concentrating member 120A are positioned such that the focal point FP remains located inside material layer 115A throughout the daylight hours. That is, those skilled in the art will recognize that the effective focal points FP(t1) and FP(t2) (see FIGS. 3(A) and 3(B)) of fixed, lens-type optical element 125A is determined in part by the incident angle of the focused light (e.g., the angle of the incident sunlight SR). In accordance with this aspect of the invention, concentrating member 120A is positioned relative to sheet 110A such that the effective focal point of element 125A remains inside material layer 115A for any incident sunlight direction. With this feature, concentrating member 120A may be implemented using an inexpensive fixed lens-type array, for example, by providing each element 125A with a sufficiently long nominal focal length FL, and by providing sheet 110A with a sufficient thickness T such that a nominal focal point of the various elements can be easily positioned inside material layer 115A (i.e., in the thickness direction), whereby variations in the focal length of the individual elements and changes in the effective focal lengths throughout the daylight hours do not produce focal points located outside of sheet 110A (i.e., above upper boundary surface 112A or below boundary surface 114A).

Figure 4:
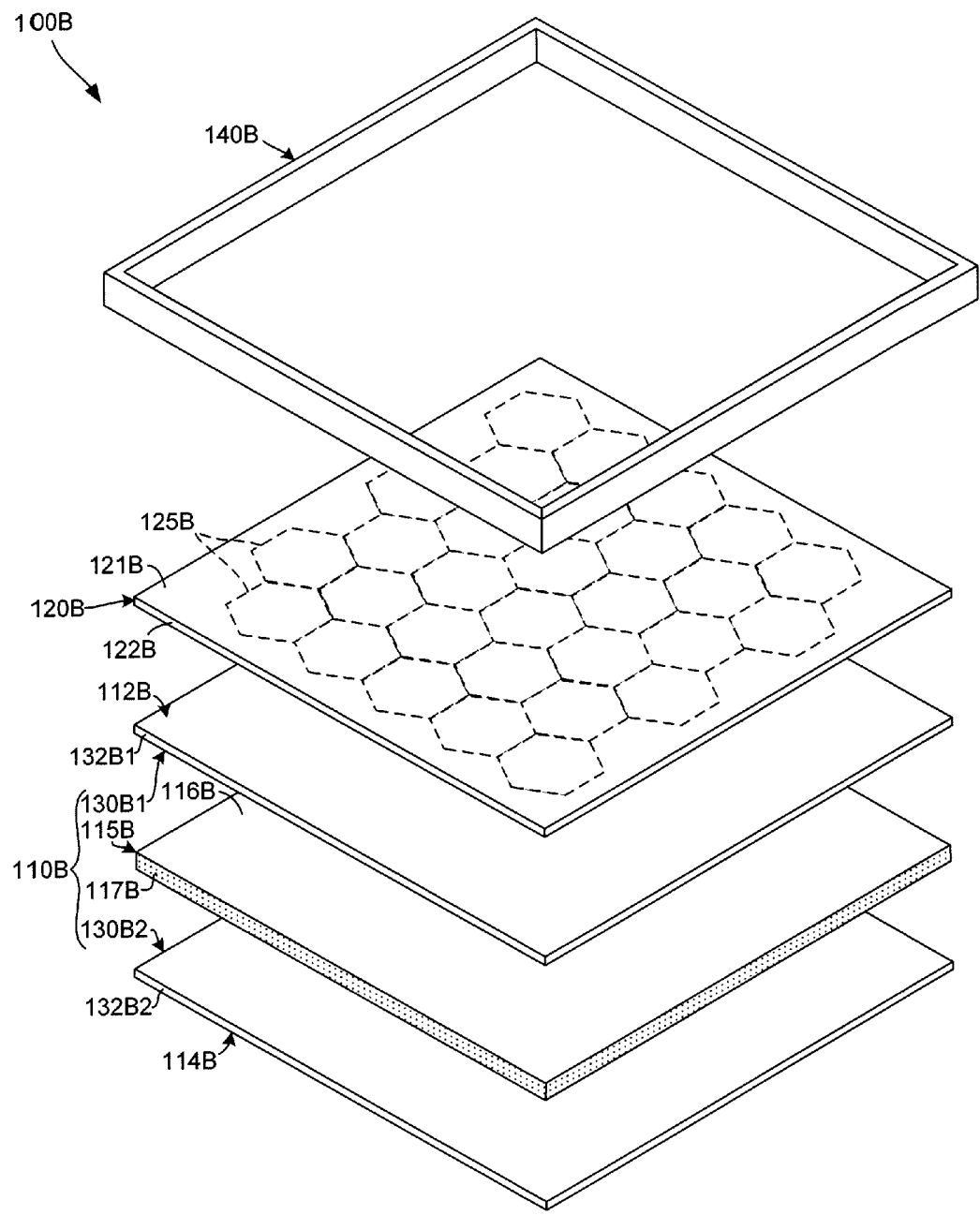
FIG. 4 is an exploded top perspective view showing a portion of a solar light transmission apparatus according to a second specific embodiment of the present invention.

FIG. 4 is an exploded top perspective view showing a portion of a solar light transmitting apparatus 100B according to a second specific embodiment of the present invention. Apparatus 100B is similar to the earlier embodiments in that it includes a sheet 110E and a lens array (solar radiation concentrating member) 120B. In addition, apparatus 100B includes a frame 140B that is connected to sheet 110B and lens array 120B as described below.

Figure 5:
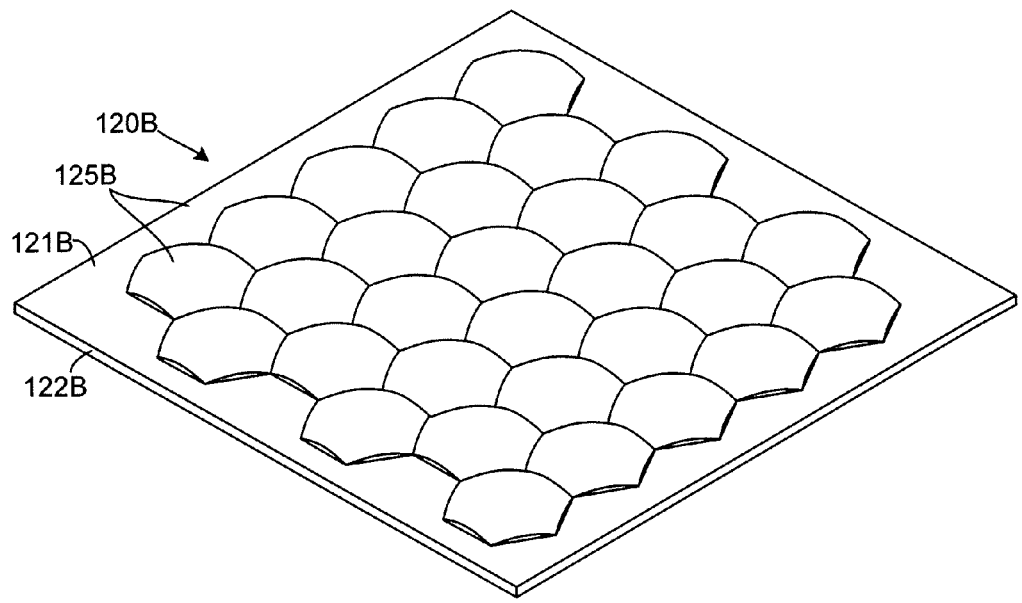
FIG. 5 is a perspective bottom view showing a lens array utilized in the apparatus of FIG. 4.

Referring to the middle portion of FIG. 4 and to FIG. 5, lens array 120B is a molded glass or plastic structure that includes multiple lenses (focusing elements) 125B maintained in a planar array by way of a base structure 121B having a peripheral side edge 122B, a lower surface 123B and an upper surface 124B. As indicated in FIG. 5, in each lens 125B of array 120B is formed by a substantially dome-shaped portion of the optical (e.g., glass or plastic) material that protrudes from lower surface 123B.

Figure 6:
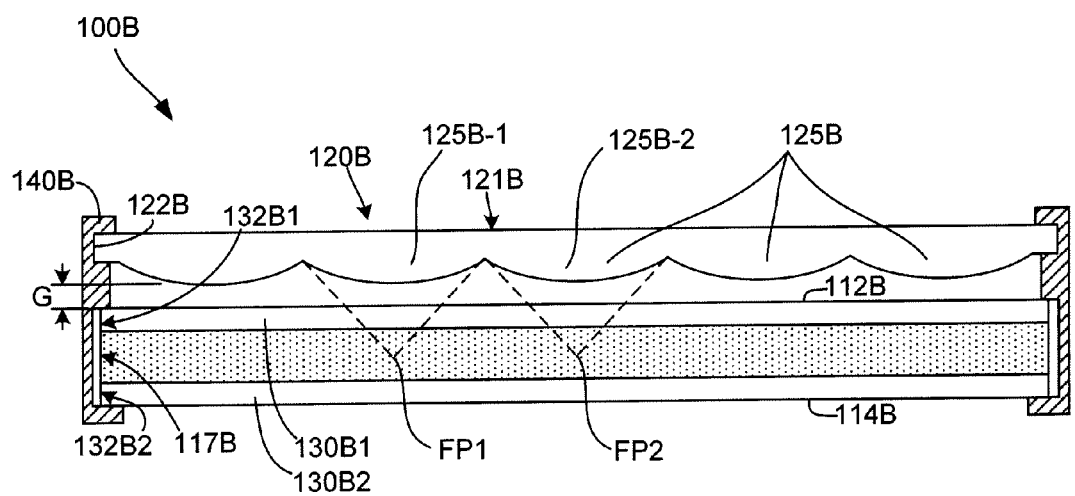
FIG. 6 is a simplified cross-sectional side view showing the solar light transmission apparatus of FIG. 4 in an assembled state.

Referring to the lower portion of FIG. 4, sheet 110B includes an upper (first) transparent layer 130B1 and a lower (second) transparent layer 130B2 that sandwich SRM-bearing material layer 115B therebetween. Upper transparent layer 130B1 and a lower transparent layer 130B2 comprise a solid light transparent material (e.g., glass or clear plastic), with the upward-facing surface of upper transparent layer 130B1 forming upper (first) surface 112B of sheet 110B, and the downward-facing surface of lower transparent layer 130B2 forming lower (second) surface 114B of sheet 110B. Upper transparent layer 13081 includes an outer peripheral edge 132B1 and lower transparent layer 130B2 includes an outer peripheral edge 132B2 that are substantially aligned with peripheral edge 117B of material layer 115B when sheet 110B is fully assembled (as indicated in FIG. 6). Disposing SRM-bearing material layer 115B between upper transparent layer 130B1 and lower transparent layer 13082 facilitates forming material layer 115B using a liquid or gel that can be contained between the transparent layers, which minimizes manufacturing costs while maximizing the durability of apparatus 100B.

FIG. 6 is a simplified cross-sectional side view showing apparatus 100B in an assembled state. As indicated in FIG. 6, rigid frame 140B includes a first peripheral mounting groove disposed to receive peripheral edges 117B, 132B1, 132B2 of sheet 110B and a second peripheral mounting groove disposed to receive peripheral edge 122B of lens array 120B such that lens array 120B is maintained at a predetermined gap distance G from the upper surface 112B of sheet 110B. By providing frame 140B with such mounting features, frame 140B both facilitates accurate and inexpensive assembly of apparatus 100B, and also serves to reliably maintain the necessary gap G between sheet 110B and lens array 120B that is needed to facilitate TIR within sheet 110B.

According to another aspect of the present embodiment, lenses (focusing elements) 125E are formed and disposed such that each lens generates an associated focal point that is located inside SRM-bearing material layer 115B. For example, as indicated in FIG. 6, lens 125B1 generates an associated focal point FP1, and lens 125B2 generates an associated focal point FP2, where focal points FP1 and FP2 are disposed in spaced-apart regions inside SRM-bearing material layer 115B. The benefit of this arrangement is that lens array 120B can be formed using low-cost molded glass or plastic sheets that also serves as a weather resistant outer layer for apparatus 100B. In a specific embodiment, each lens 125B causes a spatial light concentration in some plane of 3× or greater, even more preferably greater than 5×, and yet even more preferably greater than 10×, or preferably beyond. In another specific embodiment, upper surface 124B of lens array 120B is formed as a flat (planar) surface to facilitate easy cleaning and other maintenance.

Figure 7:
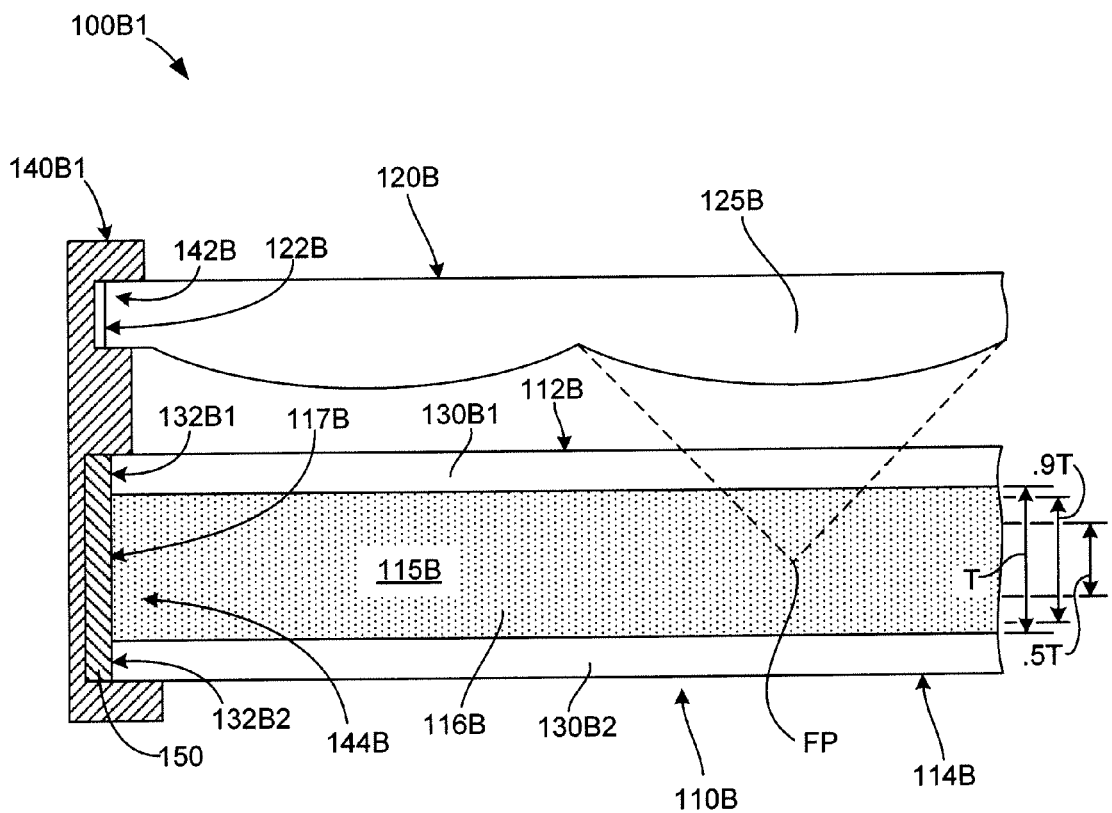
FIG. 7 is a partial cross-sectional view showing a portion of a solar light transmission apparatus of the present invention according to another embodiment of the present invention.

FIG. 7 is a partial cross-sectional view showing a portion of a solar light transmission apparatus 100C of the present invention according to another specific embodiment of the present invention. Apparatus 100C is substantially identical to apparatus 100B (described above) but includes a heat sink structure 150C having a fluid channel 155C that transfers solar radiation received from sheet 110C in a manner similar to that described above.

As also illustrated in FIG. 7, according to another aspect of the present invention, focal point FP of lens 125C is positioned within a central 90% portion (0.9 T) of material layer 115C, and even more preferably located within a central 50% portion (0.5 T) of material layer 115C, where T represents the nominal thickness of material layer 115C.

Figure 8:
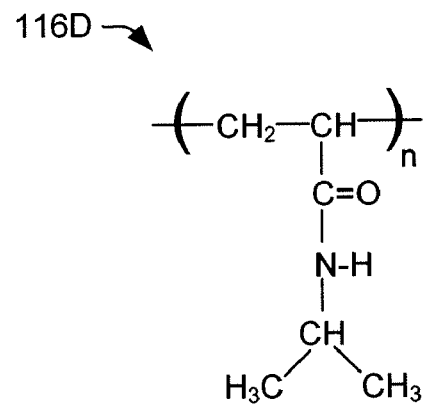
FIG. 8 is a chemical diagram for poly(N-isopropylacrylamide) (PNIPAM), which is utilized as an SRM material in accordance with a specific embodiment of the present invention.
Figure 9A:
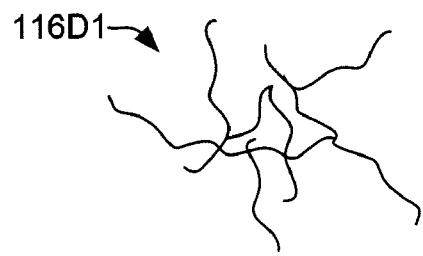
FIGS. 9(A) and 9(B) are simplified sketches depicting a PNIPAM molecule in first and second states, respectively.
Figure 9B:
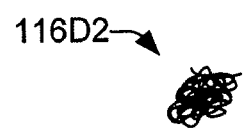

FIG. 8 is a chemical diagram for poly(N-isopropylacrylamide) (PNIPAM) 116D, which is a phase change material (PCM) utilized as an SRM material in accordance with a presently preferred embodiment of the present invention. PNIPAM is a temperature-responsive polymer that, when heated in water above 33° C., undergoes a reversible phase transition from a swollen hydrated, substantially transparent state (e.g., depicted as SRM 116D-1 shown in FIG. 9(A)) to a shrunken dehydrated, relatively opaque state (e.g., depicted as SRM 116D-2 shown in FIG. 9(B)).

Although PNIPAM provides a transparent-to-opaque phase transformation at a nearly ideal temperature for use as the SRM in the various solar light transmission apparatus described herein, the present inventors believe other SRM materials (e.g., Methyl-Cellulose) exhibiting characteristics similar to PNIPAM could also be used to produce solar light transmission apparatus falling within the spirit and scope of the present invention.

In one embodiment the SRM-bearing material layer includes a mixture of a transparent gel/liquid carrier material and a temperature dependent SRM material that is dispersed in the carrier material. In a preferred embodiment the SRM material has a lower critical solution temperature (LCST) in the range of 30° C. and 90° C. (note that PNIPAM disposed in water has an LCST of 33° C.).

In accordance with other features, the selected SRM is selected such that the focal zone has a transparent state with a linear attenuation coefficient below $1.00 \text{ cm}^{-1}$ when the SRM is in the transparent (first) state, and such that the focal zone has a refractive index greater than 1.34 at 600 nm when the SRM is in the opaque/scattering (second) state.

In yet another specific embodiment, the SRM is a photochromic material (e.g. Spiropyrans) that is characterized by assuming a first molecular structure having a light or clear color in the transparent (first) state, and by assuming a second molecular structure having a dark color in the opaque/scattering (second) state, where the dark colored state is substantially (e.g., greater than 50%) more absorptive than the light colored state.

In yet another specific embodiment, the SRM-bearing material layer mixture further includes one or more of a radiation-absorbing dye, a defoaming agent, a thickening agent, and an anti-freeze agent. The absorbing dye (e.g., NIR980A by QCR Solutions) is preferably only absorptive at wavelengths greater than 1000 nm, and assists with light absorption to create the necessary focal heating. The optional defoaming agent (e.g., Poly-Ethylene-Glycol (PEG)) is provided to assist with filling during manufacturing. The thickening agent (binder, e.g., a commercial cellulose derivative such as HPMC) and the optional anti-freeze agent are utilized to generate the desired liquid/gel consistencies and performances.

In yet another specific embodiment, the SRM-bearing material layer mixture is in a solid form and the transparent layers are omitted (i.e., the upper and lower surfaces of the SRM-bearing material layer form the upper and lower surfaces of the sheet).

Figure 10:
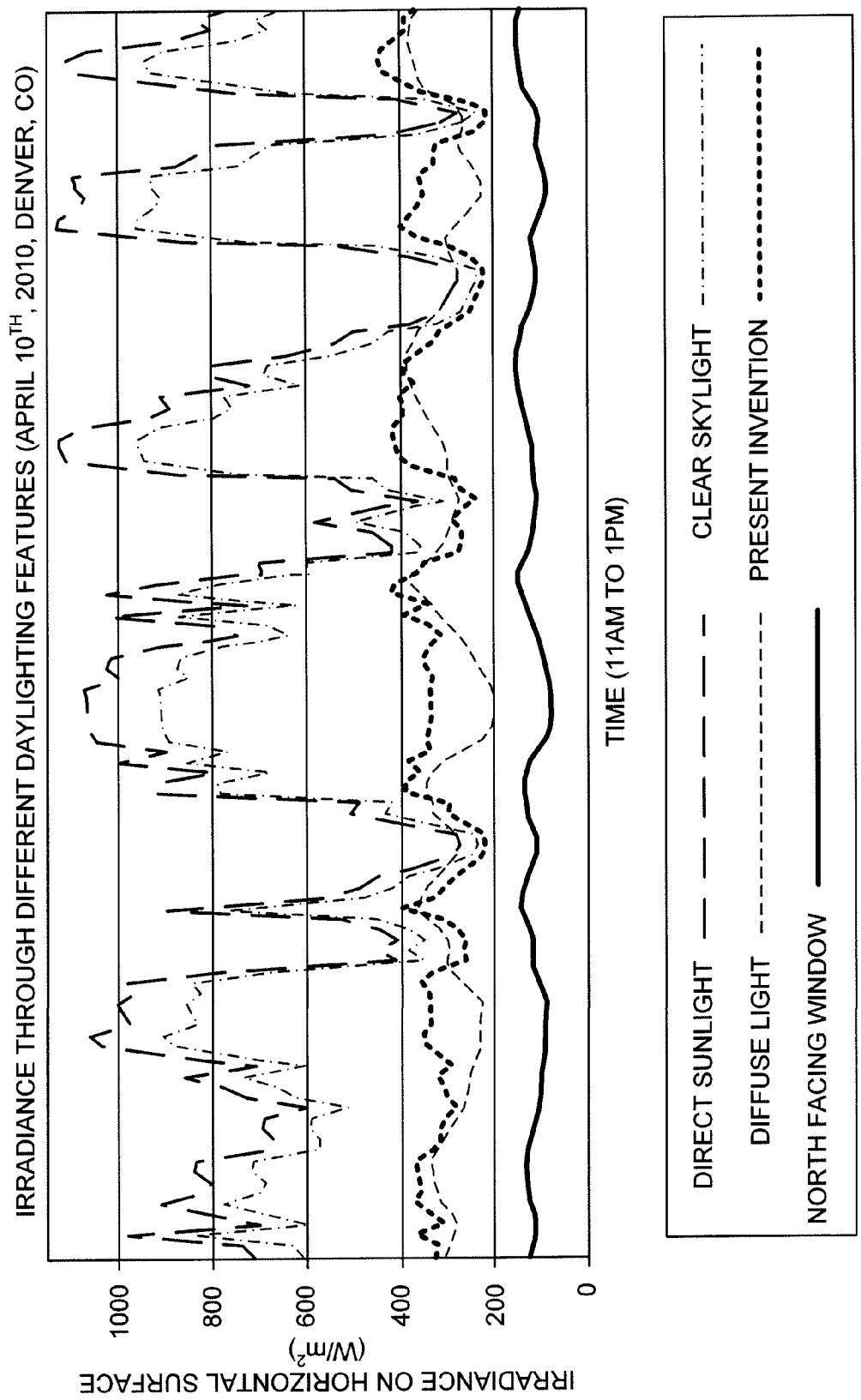
FIG. 10 is a graph illustrating light transmission properties of the solar light transmission apparatus of the present invention.

FIG. 10 is a graph showing irradiance through different daylighting features on a typical day (where sunny periods are indicated by peak irradiance values and cloudy periods are indicated by lower "trough" irradiance values). The graph includes measurements of direct sunlight and diffuse light, along with light transmission through conventional daylighting structures (e.g., clear/diffuse skylight material and translucent PV) and through a solar light transmission apparatus constructed in accordance with the present invention. As indicated in the graph, the solar light transmission apparatus produces normalized lighting that eliminates all direct sunlight (i.e., all but about 15%) and passes nearly all diffuse light (approximately 80%), thereby clearly outperforming conventional skylighting structures.

Figure 11:
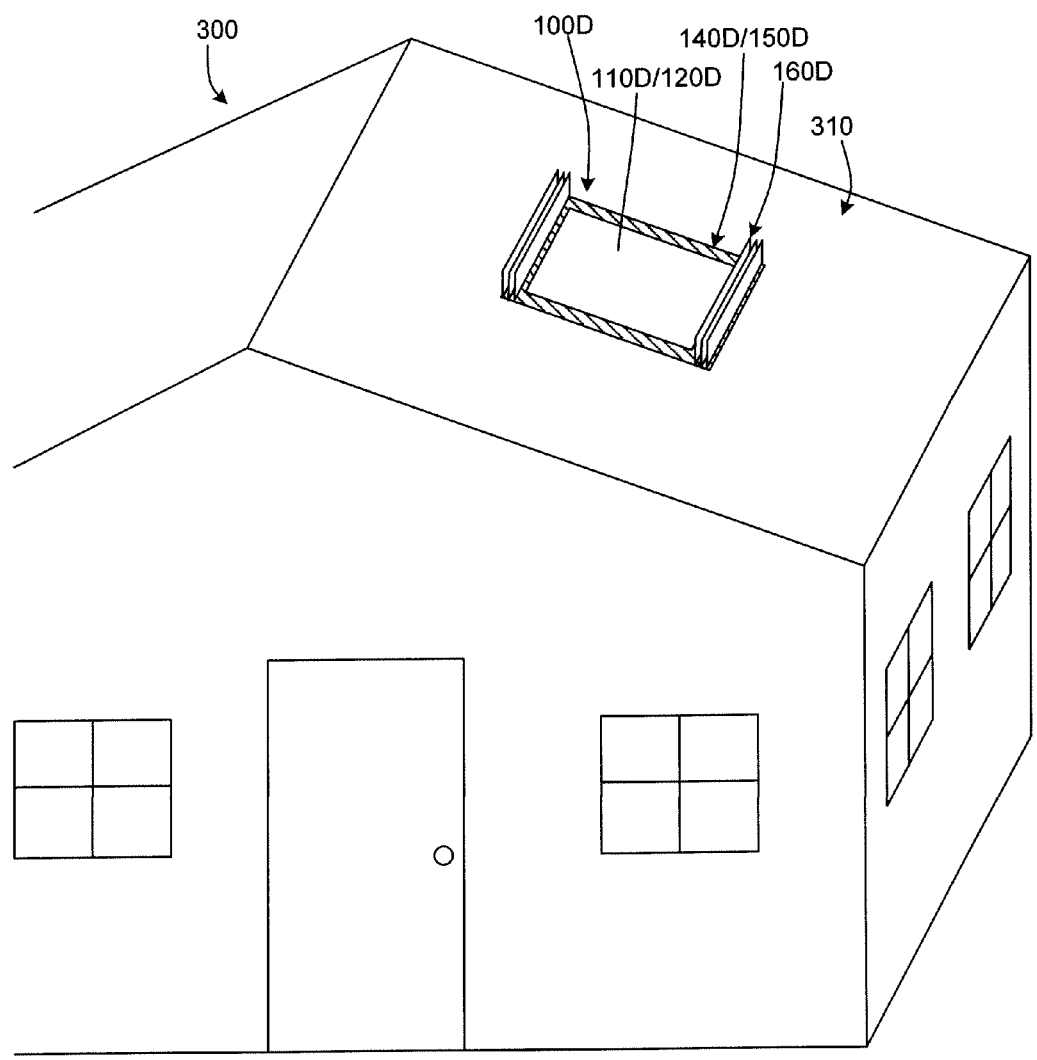
FIG. 11 is a partial perspective view showing a building structure incorporating a solar light transmission apparatus of the present invention as a roof-mounted skylight structure according to another embodiment of the present invention.

FIG. 11 is a partial perspective view showing a building structure (e.g., a house) 300 incorporating a solar light transmission apparatus 100D as a roof-mounted skylight structure according to another embodiment of the present invention. Solar light transmission apparatus 100D is operably mounted on a roof 310 of house 300 by way of a suitably adapted frame 140D such that diffuse light is transmitted through sheet 110D and light concentrating member 120D in the manner described above. In addition, solar light transmission apparatus 100D includes one or more heat radiating fins 160 that are thermally connected to heat sink 150 (disposed as described above inside frame 140D), whereby heat generated in heat sink 150 in response to the scattered sunlight is dissipated outside of house 300.

Although the present invention has been described with reference to certain specific embodiments, it will be clear to those skilled in the art that the inventive features of the present invention are applicable to other embodiments as well, all of which are intended to fall within the scope of the present invention. For example, although the present embodiment is described herein with specific reference to lens array-type concentrating members, those skilled in the art will recognize that the purpose and function of the disclosed lens arrays may be implemented using other array structures including lenses or other light focusing elements (e.g., mirrors), where each of the focusing elements concentrates a corresponding portion of incident sunlight in an associated focal zone in a manner similar that described herein. Moreover, additional features associated with the use of the present invention in conjunction with the secondary purpose of generating solar power are described in co-owned and co-filed U.S. patent application Ser. No. 12/955,688 ("SOLAR ENERGY HARVESTING DEVICE USING STIMULI-RESPONSIVE MATERIAL") (XCP-158-1), which is incorporated herein by reference in its entirety. Further, local parallelity of the sheet's boundary surfaces is only necessary for tapping out light—if the objective of a particular apparatus is to "not transmit" light into a room, local parallelity of the boundary surfaces may be omitted, while still making a well functioning apparatus according to the spirit of the present invention. Particularly when the SRM is light absorbing in the second (opaque) state, such as with "photochromics", where the sheet's "room side" could be arbitrarily formed.

The invention claimed is:

1. A self-adjusting solar light transmission apparatus comprising:
   a sheet having opposing first and second boundary surfaces and comprising a material layer including a stimuli-responsive material (SRM) that is evenly distributed throughout the material layer, said material layer being disposed between the first and second boundary surfaces; and
   means for concentrating solar radiation directed onto said apparatus such that said solar radiation is concentrated in a focal zone disposed inside the material layer,
   wherein the SRM is characterized such that all of said SRM disposed in said material layer assumes a first state when a first amount of said concentrated solar radiation in said focal zone is below a predetermined first level, and such that a portion of said SRM disposed in said focal zone changes from the first state to a second state when said concentrated solar radiation in said focal zone increases from said first amount to a predetermined second amount while a remaining portion of said SRM disposed outside of said focal zone remains in said first state, the second state being more opaque than the first state, and
   wherein said material layer comprises a sufficient quantity of said SRM such that, when said portion of said SRM in the focal zone is in said second state, at least half of said concentrated solar radiation directed onto said focal zone is prevented by said predetermined portion from passing entirely through said sheet.

2. The apparatus of claim 1,
   wherein said SRM is further characterized by being substantially entirely transparent to solar radiation in said first state, and
   wherein said material layer comprises a sufficient quantity of said SRM and said first and second boundary surfaces are essentially entirely smooth such that, when the portion of said SRM in said focal zone is in said second state, at least 40% of said concentrated solar radiation directed into said focal zone is redirected by said portion into said remaining portion, and the redirected concentrated solar radiation is temporarily retained within said sheet by total internal reflection between said first and second surfaces.

3. The apparatus of claim 2,
   wherein the opposing first and second boundary surfaces are locally parallel, and
   wherein said SRM is further characterized in that said concentrated solar radiation directed into said focal zone is at least ten times more likely to be scattered into said remaining portion as to be absorbed by said SRM portion in said focal zone.

4. The apparatus of claim 1, wherein the SRM is further characterized such that the portion of said SRM disposed in said focal zone changes from said second state back to said first state when said concentrated solar radiation in said focal zone subsequently decreases from said second amount back to said first amount.

5. The apparatus of claim 1, wherein said concentrating means comprises an optical element that is fixedly positioned relative to the sheet such that said focal zone defined by said optical element is determined by an incident angle of said solar radiation directed onto said device, whereby when said device is maintained in a stationary position throughout daylight hours, said focal zone moves inside said material layer in accordance with movement of the sun.

6. The apparatus of claim 1,
   wherein said sheet further comprises a first transparent layer including said first surface and a second transparent layer including said second surface, said first and second transparent layers consisting of a solid light transparent material, and
   wherein the material layer is disposed between said first transparent layer and said second transparent layer.

7. The apparatus of claim 6, wherein the material layer further comprises a mixture including a transparent carrier material comprising one of a gel material and a liquid, wherein said SRM comprises one of a temperature dependent material and a radiation responsive material that is dispersed in said carrier material.

8. The apparatus of claim 7, wherein said SRM comprises a temperature dependent material having a lower critical solution temperature (LCST) in the range of 30° C. and 90° C.

9. The apparatus of claim 8, wherein said mixture comprises poly(N-isopropylacrylamide) (PNIPAM) and water.

10. The apparatus of claim 7, wherein said focal zone has a transparent state with a linear attenuation coefficient below $1.00\ cm^{-1}$ when said portion of said SRM is in said first state.

11. The apparatus of claim 7, wherein said focal zone has a refractive index greater than 1.34 at 600 nm when said portion of said SRM is in said second state.

12. The apparatus of claim 7, wherein said SRM comprises a phase change material (PCM) disposed in said transparent carrier material, wherein said PCM is characterized by assuming a first molecular structure in said first state, and by assuming a second molecular structure in said second state.

13. The apparatus of claim 12, wherein the PCM material is a temperature-responsive polymer characterized by assuming a hydrated first molecular structure while a temperature of said solution in said focal zone remains below a predetermined lower critical solution temperature (LCST) temperature, and by changing to a dehydrated second molecular structure when said concentrated solar radiation increases the temperature of said solution in said focal zone above said LCST temperature.

14. The apparatus of claim 13, wherein said temperature-responsive polymer has a lower critical solution temperature (LCST) in the range of 30° C. and 90° C.

15. The apparatus of claim 13, wherein said PCM material is further characterized by transitioning from said second molecular structure back to said first molecular structure in said focal zone when the temperature of said solution in said focal zone is reduced from above the LCST temperature to below the LCST temperature.

16. The apparatus of claim 15, wherein said PCM material comprises one of poly(N-isopropylacrylamide) (PNIPAM) and methyl cellulose.

17. The apparatus of claim 7, wherein said SRM comprises a photochromic material characterized by assuming a first molecular structure in said first state, and by assuming a second molecular structure in said second state, wherein said first molecular structure has a first color that is essentially transparent to said concentrated solar radiation, a said second molecular structure has a second color that is substantially less transparent to said concentrated solar radiation than said first molecular structure.

18. The apparatus of claim 7, wherein said mixture further comprises one or more of a radiation-absorbing dye, a defoaming agent, a thickening agent, and an anti-freeze agent.

19. The apparatus of claim 18, wherein said mixture comprises a selective near infrared (NIR) dye.

20. The apparatus of claim 1, wherein said material layer comprises a solid structure including said SRM.

21. The apparatus of claim 1, wherein said concentration means comprises an array of focusing elements disposed such that each of the focusing elements generates at least one associated focal point that is located inside of the material layer.

22. The apparatus of claim 21, wherein said concentration means comprises a lens array including a plurality of lens structures disposed in a planar arrangement such that each of the plurality of lens structures generates an associated focal point that is located inside of said sheet.

23. The apparatus of claim 22, wherein each of said plurality of lens structures is disposed to facilitate a spatial light concentration in some plane of 3× or greater.

24. The apparatus of claim 22, wherein said sheet has a predetermined thickness, and wherein said focal point of each of said plurality of lens structures is located within a central 90% portion of the thickness of said sheet.

25. The apparatus of claim 1, wherein the sheet comprises a peripheral edge extending between the first and second surfaces, and wherein the apparatus further comprises a frame disposed on the peripheral edge of the sheet and being connected to said concentrating means such that said concentrating means is maintained at a predetermined gap distance from the first surface of the sheet.

26. The apparatus of claim 1, further comprising a radiation absorbing structure disposed along the peripheral edge of the sheet and extending at least a portion of the distance between the first and second boundary surfaces and disposed in radiative contact with the SRM for absorbing guided light travelling in the sheet.

27. The apparatus of claim 26, further comprising a heat exchange structure that is in thermal contact with the radiation absorbing structure and disposed outside of the peripheral edge of the sheet such that heat absorbed by said radiation absorbing structure is transferred to said heat exchange structure for dissipation in a region disposed away from said sheet.

* * * * *